US009275853B2

United States Patent
Sato et al.

(10) Patent No.: US 9,275,853 B2
(45) Date of Patent: Mar. 1, 2016

(54) METHOD OF ADJUSTING A TRANSISTOR GATE FLAT BAND VOLTAGE WITH ADDITION OF $AL_2O_3$ ON NITRIDED SILICON CHANNEL

(71) Applicant: Applied Materials, Inc., Santa Clara, CA (US)

(72) Inventors: Tatsuya Sato, San Jose, CA (US); Steven C. H. Hung, Sunnyvale, CA (US); Eran Newman, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/444,783

(22) Filed: Jul. 28, 2014

(65) Prior Publication Data
US 2015/0031196 A1 Jan. 29, 2015

Related U.S. Application Data
(60) Provisional application No. 61/859,343, filed on Jul. 29, 2013.

(51) Int. Cl.
| | | |
|---|---|---|
| *H01L 21/768* | (2006.01) | |
| *H01L 29/66* | (2006.01) | |
| *H01L 21/02* | (2006.01) | |
| *H01L 29/51* | (2006.01) | |
| *H01L 29/40* | (2006.01) | |
| H01L 21/306 | (2006.01) | |
| H01L 21/321 | (2006.01) | |

(52) U.S. Cl.
CPC ...... *H01L 21/02181* (2013.01); *H01L 21/0228* (2013.01); *H01L 21/02178* (2013.01); *H01L 21/02301* (2013.01); *H01L 29/401* (2013.01); *H01L 29/513* (2013.01); *H01L 29/517* (2013.01); *H01L 21/306* (2013.01); *H01L 21/321* (2013.01)

(58) Field of Classification Search
None
See application file for complete search history.

(56) References Cited

U.S. PATENT DOCUMENTS

| | | | |
|---|---|---|---|
| 6,632,747 B2 | 10/2003 | Niimi et al. | |
| 2005/0099091 A1* | 5/2005 | Mishima et al. | 310/313 R |
| 2005/0124121 A1* | 6/2005 | Rotondaro et al. | 438/287 |
| 2005/0271812 A1* | 12/2005 | Myo et al. | 427/248.1 |
| 2010/0279515 A1* | 11/2010 | Yu et al. | 438/785 |
| 2012/0207928 A1* | 8/2012 | Dussarrat et al. | 427/255.28 |
| 2012/0276720 A1 | 11/2012 | Jagannathan et al. | |
| 2013/0295759 A1* | 11/2013 | Lu et al. | 438/591 |
| 2014/0070334 A1 | 3/2014 | Chudzik et al. | |
| 2014/0252493 A1 | 9/2014 | Frank et al. | |
| 2014/0349480 A1* | 11/2014 | Shek et al. | 438/652 |

* cited by examiner

Primary Examiner — Pamela E Perkins
(74) Attorney, Agent, or Firm — Patterson & Sheridan, LLP

(57) ABSTRACT

Embodiments of the disclosure generally relate to methods of adjusting transistor flat band voltage, and transistor gates formed using the same. In one embodiment, a method sequentially includes cleaning a substrate, annealing the substrate in a nitrogen-containing environment to form silicon-nitrogen bonds, hydroxylating the substrate surface, and depositing a hafnium oxide layer over the substrate. In another embodiment, the method further includes depositing an aluminum oxide layer over the substrate prior to depositing the hafnium oxide layer, and then annealing the substrate.

15 Claims, 5 Drawing Sheets

METHOD OF ADJUSTING A TRANSISTOR GATE FLAT BAND VOLTAGE WITH ADDITION OF $AL_2O_3$ ON NITRIDED SILICON CHANNEL

CROSS-REFERENCE TO RELATED APPLICATIONS

This application claims benefit of U.S. Provisional Patent Application Ser. No. 61/859,343, filed Jul. 29, 2013, which is herein incorporated by reference.

BACKGROUND OF THE DISCLOSURE

1. Field of the Disclosure

Embodiments of the present disclosure generally relate to transistor gate structures and methods of forming the same.

2. Description of the Related Art

A transistor is a semiconductor device used to amplify and switch electronic signals and electrical power. It is composed of semiconductor material with at least three terminals for connection to an external circuit. A voltage or current applied to one of the transistor's terminals changes the current through another pair of terminals. For example, a voltage applied to a gate of a transistor affects the current flowing between a source terminal and a sink terminal of the transistor. The threshold voltage of the gate at which current flows between the source terminal and the sink terminal is the flat band voltage ($V_{FB}$). In conventional metal-oxide-semiconductor FETs (MOSFETs), the threshold voltage often fails to meet the desired value. In some cases, electrode stacks are chosen according to work function to provide the desired characteristics, but this often does not work. Moreover, threshold voltage shifts can vary significantly from desired values resulting in undesired shifts which affect device performance.

Thus, there is a need in the art for a method and apparatus for flatband voltage tuning of high-k field effect transistors.

SUMMARY OF THE DISCLOSURE

Embodiments of the disclosure generally relate to methods of adjusting transistor flat band voltage, and transistor gates formed using the same. In one embodiment, a method sequentially includes cleaning a substrate, annealing the substrate in a nitrogen-containing environment to form silicon-nitrogen bonds, hydroxylating the substrate surface, and depositing a hafnium oxide layer over the substrate. In another embodiment, the preceding method further includes depositing an aluminum oxide layer over the substrate prior to depositing the hafnium oxide layer, and annealing the substrate after depositing the hafnium oxide layer.

In another embodiment, a method of forming a gate stack sequentially comprises cleaning a surface of a substrate, annealing the substrate in an atmosphere comprising ammonia, hydroxylating the surface of the substrate in an atmosphere comprising water and ammonia, and depositing a hafnium oxide layer on a surface of the substrate.

In another embodiment, a method of forming a gate stack sequentially comprises cleaning a surface of a substrate, annealing the substrate in an atmosphere comprising ammonia, hydroxylating the surface of the substrate in an atmosphere comprising water and ammonia, depositing an aluminum oxide layer on a surface of the substrate, depositing a hafnium oxide layer on the aluminum oxide layer, and annealing the substrate having the aluminum oxide layer and the hafnium oxide layer thereon.

In another embodiment, a method of forming a gate stack sequentially comprises cleaning a surface of a substrate, wherein cleaning the substrate comprises exposing the substrate to ionized $NF_3$ and $NH_3$; annealing the substrate in an atmosphere comprising ammonia; hydroxylating the surface of the substrate in an atmosphere comprising water and ammonia, wherein a relative humidity is between about 45 percent and about 90 percent during the hydroxylating the surface; depositing an aluminum oxide layer on the surface of the substrate; and depositing a hafnium oxide layer on the aluminum oxide layer, wherein the hafnium oxide layer is formed during an atomic layer deposition process by reacting a hafnium precursor and an oxidizing agent.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the disclosure generally relate to methods of adjusting transistor flat band voltage, and transistor gates formed using the same. In one embodiment, a method sequentially includes cleaning a substrate, annealing the substrate in a nitrogen-containing environment to form silicon-nitrogen bonds, hydroxylating the substrate surface, and depositing a hafnium oxide layer over the substrate. In another embodiment, the method further includes depositing an aluminum oxide layer over the substrate prior to depositing the hafnium oxide layer, and annealing the substrate after depositing the hafnium oxide layer.

Figure 1:
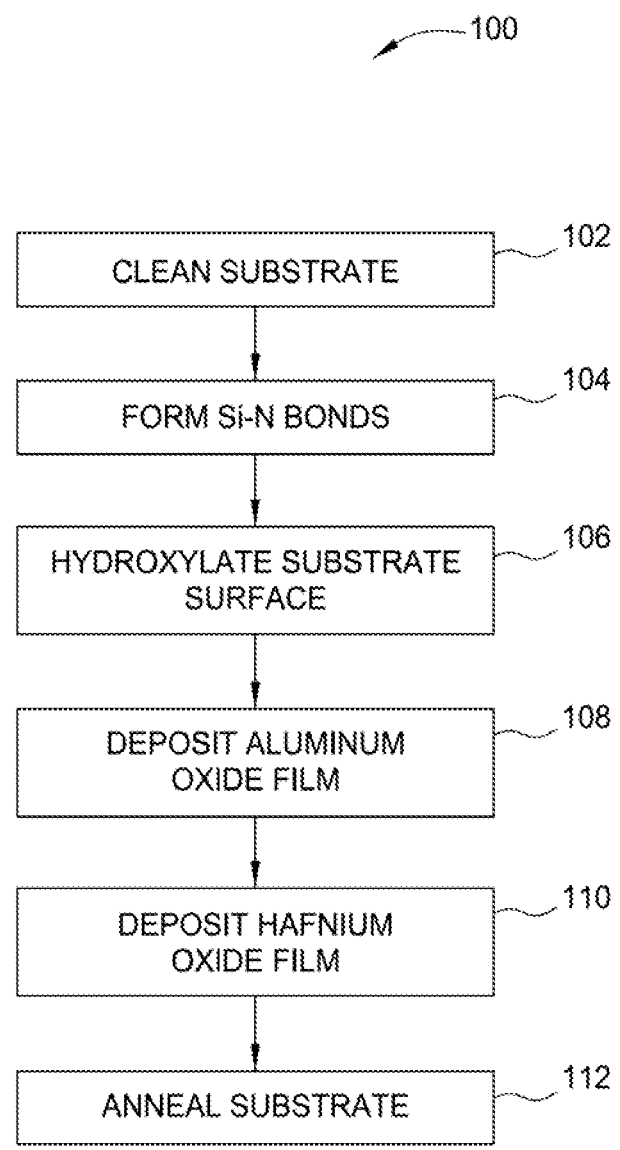
FIG. 1 is a flow diagram illustrating a method of forming a gate stack, according to one embodiment of the disclosure.

FIG. 1 is a flow diagram 100 illustrating a method of forming a gate stack, according to one embodiment of the disclosure. The flow diagram 100 begins at operation 102. In operation 102, a substrate, such as a silicon substrate, is cleaned to remove a native oxide layer and/or impurities from a surface thereof. The surface of the substrate may be cleaned using a dry clean, such as a plasma etch, or a wet clean, such as a diluted hydrofluoric acid (HF) clean. In one example, the dry clean may be a SiCoNi™ etch. A SiCoNi™ etch is a remote plasma assisted dry etch process which involves the simultaneous exposure of a substrate to $NF_3$ and $NH_3$ plasma by-products. Remote plasma excitation of species allows plasma-damage-free substrate processing. The SiCoNi™ etch is largely conformal and selective towards silicon oxide layers and does not readily etch silicon regardless of whether the silicon is amorphous, crystalline or polycrystalline. The SiCoNi™ process produces solid by-products which grow on the surface of the substrate as substrate material is removed. The solid by-products are subsequently removed via sublimation when the temperature of the substrate is raised. The SiCoNi™ process results in a substrate surface having silicon-hydrogen (Si—H) bonds thereon.

In one embodiment, a SiCoNi™ etch may include an $NF_3$ flow rate within a range of about 1 sccm to about 20 sccm, such as about 5 sccm, as well as an $NH_3$ flow rate within a range of about 50 sccm to about 200 sccm, such as about 100 sccm. The SiCoNi™ etch may be performed at a pressure of about 5 torr, and an RF power setting of about 30 watts may be utilized to ionize the $NF_3$ and the $NH_3$. By-products may then be sublimated from the surface of the substrate by annealing the substrate at temperature of about 120 degrees Celsius or more for about 5 seconds to about 100 seconds, such as about 60 seconds.

In another embodiment, the substrate surface may be cleaned using hydrofluoric acid in water, within a range of about 1:100 to about 1:200. The substrate may be maintained at room temperature, or for example, about 20 degrees Celsius, for up to 10 minutes. The cleaned substrate surface results in a surface having silicon-hydrogen (Si—H) bonds thereon.

After cleaning the substrate in operation 102, silicon nitride (Si—N) bonds are formed on a surface of the substrate during operation 104. The silicon nitride surface is formed by annealing the cleaned substrate in nitrogen-containing environment, for example, an ammonia-containing environment. It is contemplated that the ammonia-containing environment may contain other gases, such as nitrogen ($N_2$), hydrogen ($H_2$), and argon (Ar). In one example, the substrate may be annealed in a RADOX™ chamber available from Applied Materials, Inc. in Santa Clara, Calif. The atmosphere within the chamber may be maintained at a partial pressure of ammonia within a range of about 1 torr to about 760 torr, such as about 100 torr. The substrate may be annealed for about 1 second to about 120 seconds, such as about 10 seconds, at a temperature within a range of about 400 degrees Celsius to about 900 degrees Celsius, such as about 600 degrees Celsius. The annealing process of operation 104 results in a silicon nitride bonds on the surface of the substrate.

Subsequently, in operation 106, the substrate is exposed to an environment including water ($H_2O$) and ammonia ($NH_3$) to hydroxylate the surface of the substrate. The relative humidity of the environment may be about 45 percent (%) to about 90%, such as about 60%, while the ratio of ammonia to water may be less than about 5:1, such as about 2:1. In one example, the environment may exclude ammonia. The hydroxylation process may occur at a temperature of about 10 degrees Celsius to about 40 degrees Celsius, such as about 20 degrees Celsius, for a time of about 10 seconds to about 600 seconds, such as about 60 seconds. Operation 106 results in substrate surface having Si—OH bonds thereon.

In operation 108, an aluminum oxide ($Al_2O_3$) layer is deposited over the hydroxylated surface of the substrate. In one example, the aluminum oxide layer may be deposited on the hydroxylated surface by atomic layer deposition (ALD) to a thickness less than about 10 angstroms, such as about 2 angstroms to about 3.5 angstroms. In such an embodiment, the substrate may be maintained at a temperature of about 80 degrees Celsius to about 400 degrees Celsius, such as about 275 degrees Celsius, while reacting an aluminum precursor with an oxidizing agent. Suitable aluminum precursors include, for example, metal organic aluminum precursors, such as trimethylaluminum (TMA), tritertiarybutylaluminum (TTBA), triisobutylaluminum (TIBA), and aluminum tetramethylheptandionate ($Al(TMHD)_3$). Suitable oxidizing agents include $H_2O$ and ozone.

After formation of the aluminum oxide layer, a hafnium oxide layer is formed on the surface of the aluminum oxide layer in operation 110. The hafnium oxide layer may be deposited to a thickness of about 5 angstroms to about 50 angstroms, such as about 30 angstroms, using and ALD process. During the ALD process, the substrate may be maintained at a temperature within a range of about 200 degrees Celsius to about 400 degrees Celsius, such as about 275 degrees Celsius, while reacting a hafnium precursor with an oxidizing agent. Examples of suitable hafnium precursors include, for example, hafnium halides and metal organic hafnium precursors such as hafnium chloride ($HfCl_4$), tetrakis(diethylamino)hafnium (TDEAH), tetrakis(dimethylamino)hafnium (TDMAH), and tetrakis(ethylmethylamino) hafnium (TEMAH). Suitable oxidizing agents include $H_2O$ and ozone.

In operation 112, the substrate having the hafnium oxide layer thereon is annealed in an environment having a partial pressure of oxygen less than about 100 millitorr (mtorr), such as 0 mtorr. The ambient may include one or more of N2, He, Ar, or other gases which are inert with respect to the substrate and layers deposited thereon. The anneal process may be performed for about 1 second to about 120 seconds, for example, about 10 seconds, at temperature of about 400 degrees Celsius to about 900 degrees Celsius, such as about 700 degrees Celsius.

It is to be understood that the operations 102-112 facilitate the formation of a gate electrode having tunable properties. For example, as will be further illustrated in FIGS. 3A and 3B, performing operations within different portions of the disclosed ranges results in different properties of the gate stack. In addition, while FIG. 1 discloses one embodiment, other embodiments are also contemplated. In another embodiment, it is contemplated that flow diagram 100 may exclude operations 108 and 112. In another embodiment, the substrate may be a germanium substrate or silicon-germanium substrate.

Figure 2:
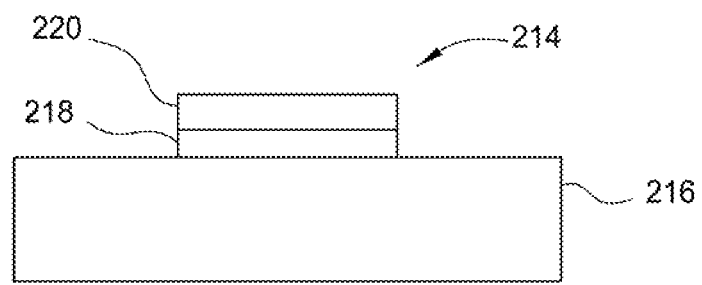
FIG. 2 illustrates a gate stack formed using the flow diagram of FIG. 1.

FIG. 2 illustrates a gate stack 214 formed using the flow diagram of FIG. 1. The gate stack 214 is formed on a substrate 216, such as a monocrystalline or polycrystalline silicon substrate. The gate stack 214 includes an aluminum oxide layer 218 formed on the substrate 216, and a hafnium oxide layer 220 formed on the aluminum oxide layer 218. The substrate 216 may also include source and drain regions (not shown). In one embodiment, the aluminum oxide layer 218 functions as a dipole layer to facilitate the tuning of the $V_{FB}$ of the gate stack. As will be further explained with reference to FIG. 3, the properties of the aluminum oxide layer 218 (e.g., thickness or anneal conditions, such as length and time) affect the $V_{FB}$ of the device, thus allowing for tunability of the device.

Figure 3A:
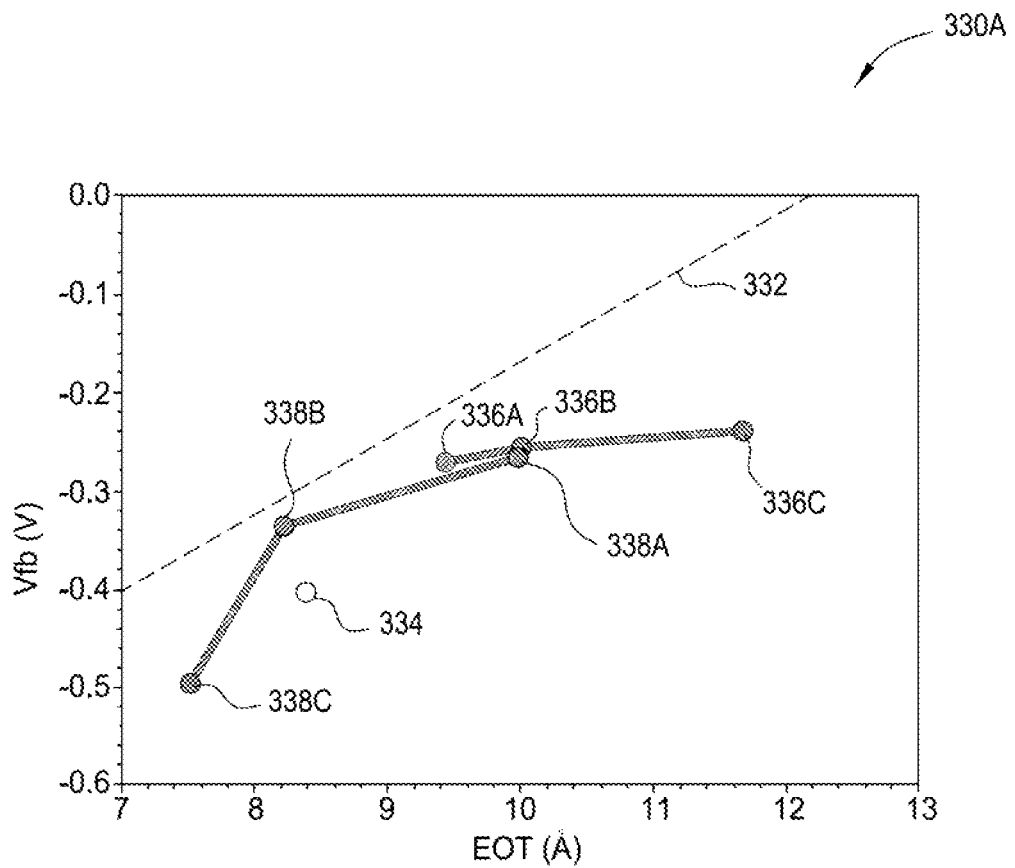
FIGS. 3A and 3B are charts illustrating properties of gate stacks formed using embodiments of the disclosure.
Figure 3B:
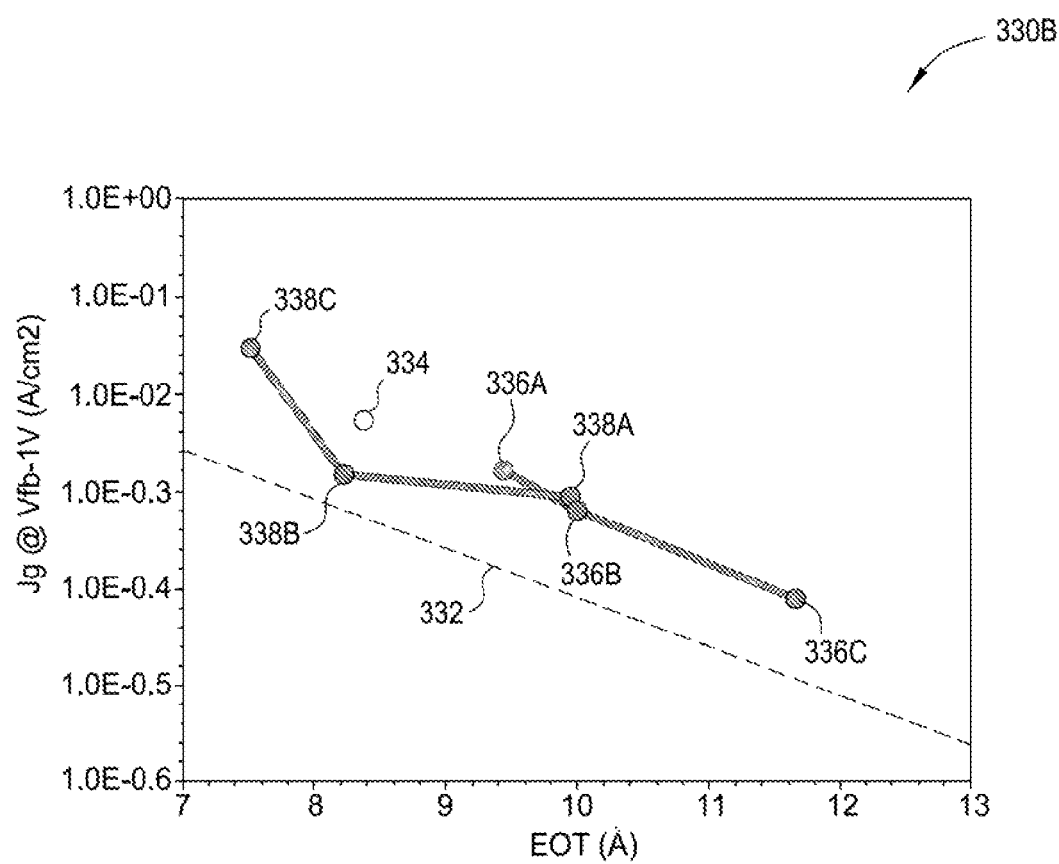

FIGS. 3A and 3B include charts 330A, 330B illustrating properties of gate stacks formed using embodiments of the disclosure. The chart 330A shown in FIG. 3A illustrates Equivalent Oxide Thickness (EOT) versus $V_{FB}$ for multiple gate stacks formed according to embodiments described herein. As is illustrated, $V_{FB}$ can be tuned or adjusted depending on selected parameters. For example, it is possible to desirably reduce the $V_{FB}$ of a gate stack in some instances.

The chart 330A includes a reference line 332 that represents a gate stack including a silicon dioxide interface layer disposed on a silicon substrate and having a 35 angstrom hafnium oxide layer thereon. The slope of the reference line 332 illustrates the change in the $V_{FB}$ of the stack as the EOT of the silicon dioxide layer changes.

Point 334 on the chart 330A illustrates a gate stack formed using operations 102, 104, 106, and 110 of flow diagram 100 shown in FIG. 1. The hafnium oxide layer is deposited to a thickness of about 35 angstroms. As shown in chart 330A, the gate stack represented by point 334 has a $V_{FB}$ difference of about 100 millivolts (mV) compared to the reference. Points 336A, 336B, and 336C represent gate stacks formed using operations 102, 104, 106, 108, and 110 of flow diagram 100 shown in FIG. 1. The gate stacks represented by points 336A-336C are formed using equivalent process conditions, however, the thickness of the aluminum oxide layers thereon are deposited to different thicknesses. The gate stack represented by point 336A includes an aluminum oxide layer having a thickness of about 1 angstroms, while the points 336B and 336C represent gate stacks having aluminum oxide layers of about 2.2 angstroms and about 6 angstroms, respectively. As illustrated by the chart 330A, as the aluminum oxide layer increases in thickness, the $V_{FB}$ of the stack shifts further from the reference line 332, thus indicating a greater absolute threshold voltage for a particular gate stack relative to the reference line.

The points 338A, 338B, and 338C were formed using operations 102, 104, 106, 108, 110, and 112 of flow diagram 100 shown in FIG. 1. The gate stacks represented by the points 338A-338C were formed using the same process conditions with the exception of annealing temperature in operation 112. Each of the gate stacks represented by points 338A-338C includes a aluminum oxide layer having a thickness of about 2.2 angstroms, and a hafnium oxide layer having a thickness of about 35 angstroms.

The gate stack represented by point 338A was annealed in a substantially pure nitrogen ($N_2$) environment at 600 degrees Celsius. The resulting gate stack had an EOT of about 10 angstroms and a $V_{FB}$ of about –0.25 V. The gate stack represented by point 338B was annealed in a substantially pure nitrogen ($N_2$) environment at 700 degrees Celsius. The resulting gate stack had an EOT of about 8.2 angstroms and a $V_{FB}$ of about –0.34 V. The gate stack represented by point 338C was annealed in a substantially pure nitrogen ($N_2$) environment at 800 degrees Celsius. The resulting gate stack had an EOT of about 7.5 angstroms and a $V_{FB}$ of about –0.49 V. It is to be noted that the gate stack represented by point 338B has approximately an 80 mV shift in $V_{FB}$ compared to the gate stack represented by point 334. Additionally, the gate stack represented by pointy 338B is about 20 mV from the reference line 332 having an EOT of about 8.2 angstroms; however, the aluminum oxide layer of the gate is only about 2.2 angstroms. Therefore, fabrication of this smaller device is possible while still maintaining comparable performance to devices having larger interface layers with lower dielectric constant (e.g., silicon dioxide layers between the substrate and hafnium oxide layer, with a dielectric constant of about 3.9 while that of aluminum oxide is about 9). As illustrated by the chart 330A, the inclusion of an aluminum oxide layer, with or without annealing, facilitates the tuning of $V_{FB}$ of gate stacks in order to obtain desired results, particularly without EOT change by appropriate annealing.

FIG. 3B includes a chart 330B illustrating leakage current density ($J_g$) as a function of EOT of the same gate stacks represented in FIG. 3A. As indicated in chart 330B, leakage current density for gate stacks incorporating an aluminum oxide layer (e.g., points 336A-336C) decreases with an increase in EOT. The addition of a nitrogen-atmosphere anneal (e.g., points 338A-338C) decreases EOT. In particular, the range between 600 degrees (e.g., point 338A) and 800 degrees Celsius (e.g., point 338C) shifts closer to the reference line and has a favorable reduction in leakage current density of about 8 times at the same EOT, notably at about 700 degrees Celsius.

As illustrated by the above, properties of a gate stack, including $V_{FB}$ and leakage current density, can be adjusted by using the method illustrated in flow diagram 100. Additionally, gate stacks formed using embodiments of the disclosure do not include a silicon dioxide interface layer, and thus allow the formation of smaller devices.

Figure 4:
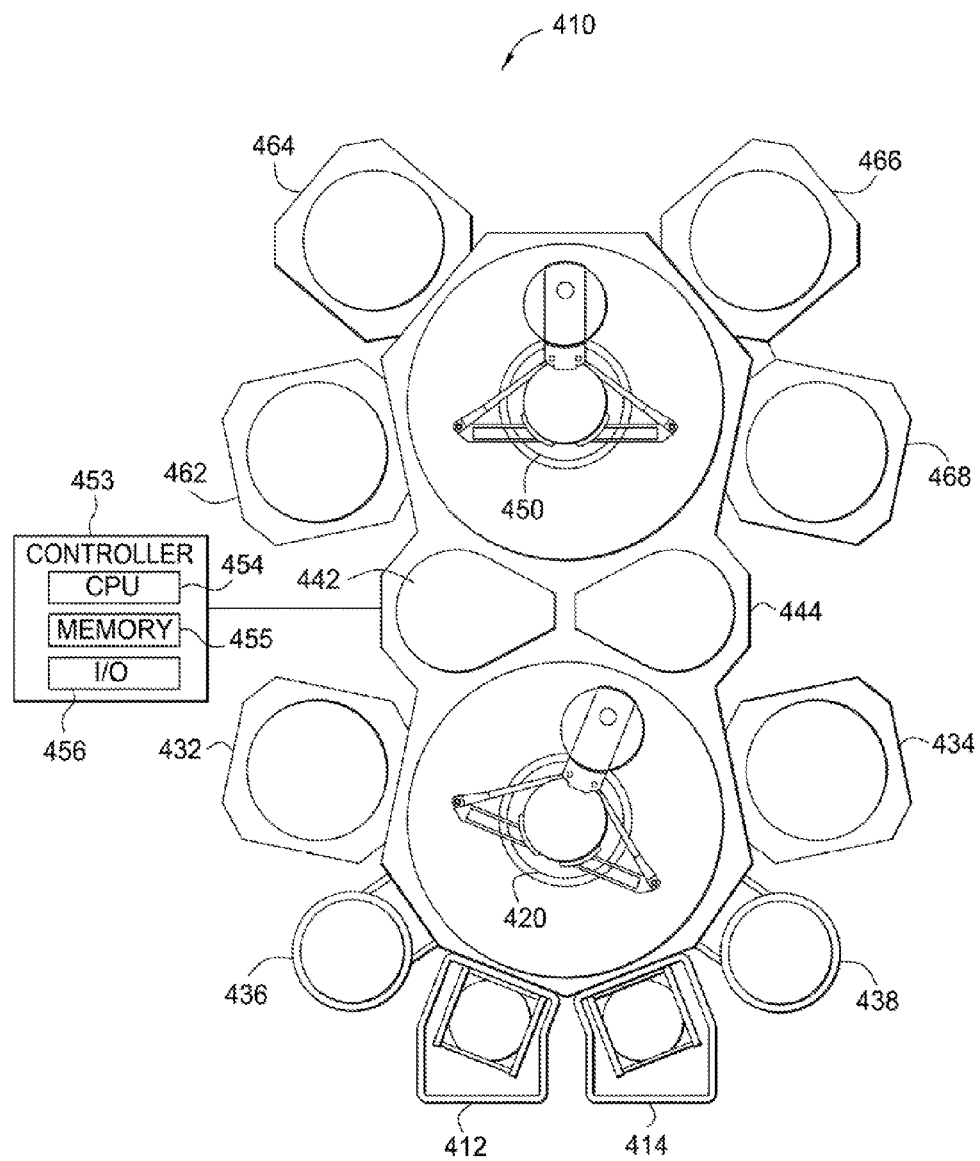
FIG. 4 illustrates a system for practicing embodiments of the disclosure.

FIG. 4 illustrates a system 410 for practicing embodiments of the disclosure. The system 410 can include one or more load lock chambers 412, 414 for transferring substrates into and out of the system 410. Typically, since the system 410 is under vacuum, the load lock chambers 412, 414 may "pump down" substrates introduced into the system 410. A first robot 420 may transfer the substrates between the load lock chambers 412, 414, and a first set of one or more substrate processing chambers 432, 434, 436, 438. Each processing chamber 432, 434, 436, 438, may be configured to perform a number of substrate processing operations. For example, processing chamber 432 can be an etch chamber designed to practice an etch process, and processing chamber 434 can be a deposition reaction chamber for performing ALD or chemical vapor deposition (CVD), or a rapid thermal processing (RTP) or RadOx® chamber designed to form a thermal oxide layer on a substrate. Processing chambers 436, 438 may also be configured to further provide, for example, ALD, CVD, physical vapor deposition (PVD), etch, pre-clean, chemical clean, thermal treatment such as RTP, plasma nitridation, degas, orientation, hydroxylation, and other substrate processes.

The first robot 420 can also transfer substrates to/from one or more transfer chambers 442, 444. The transfer chambers 442, 444 can be used to maintain vacuum conditions while allowing substrates to be transferred within the system 410. A second robot 450 can transfer the substrates between the transfer chambers 442, 444 and a second set of one or more processing chambers 462, 464, 466, 468. Similar to processing chambers 432, 434, 436, 438, the processing chambers 462, 464, 466, 468 can be configured to perform a variety of substrate processing operations, including etch processes, in addition to cyclical layer deposition (CLD), ALD, CVD, PVD, epitaxial deposition, etch, pre-clean, chemical clean, thermal treatment such as RTP/RadOx®, plasma nitridation, degas, and orientation. Any of the substrate processing chambers 432, 434, 436, 438, 462, 464, 466, 468 may be removed from the system 410 if not desired.

Controller 453 may be one of any form of general-purpose data processing system that can be used in an industrial setting for controlling the various subprocessors and subcontrollers. Generally, controller 453 includes a central processing unit (CPU) 454 in communication with memory 455 and input/output (I/O) circuitry 456, among other common components.

While the foregoing is directed to embodiments of the present disclosure, other and further embodiments of the disclosure may be devised without departing from the basic scope thereof, and the scope thereof is determined by the claims that follow.

What is claimed is:

1. A method of forming a gate stack, sequentially comprising:
    cleaning a surface of a substrate;
    annealing the substrate in an atmosphere comprising ammonia;
    hydroxylating the surface of the substrate in an atmosphere comprising water and ammonia, wherein the ratio of the ammonia to the water during the hydroxylation is less than about 5:1, and the relative humidity during the hydroxylation is between about 45 percent and about 90 percent; and depositing a hafnium oxide layer on the surface of the substrate.

2. The method of claim 1, wherein cleaning the substrate comprises exposing the substrate to hydrofluoric acid.

3. The method of claim 1, wherein cleaning the substrate comprises exposing the substrate to ionized $NF_3$ and $NH_3$.

4. The method of claim 1, wherein the hafnium oxide layer is formed during an atomic layer deposition process by reacting a hafnium precursor and an oxidizing agent.

5. The method of claim 4, wherein the hafnium precursor is selected from the group consisting of hafnium chloride, tetrakis(diethylamino)hafnium, tetrakis(dimethylamino)hafnium, and tetrakis(ethylmethylamino)hafnium.

6. A method of forming a gate stack, sequentially comprising:

cleaning a surface of a substrate;

annealing the substrate in an atmosphere comprising ammonia;

hydroxylating the surface of the substrate in an atmosphere comprising water and ammonia, wherein the ratio of the ammonia to the water during the hydroxylation is less than about 5:1, and the relative humidity during the hydroxylation is between about 45 percent and about 90 percent;

depositing an aluminum oxide layer on the surface of the substrate;

depositing a hafnium oxide layer on the aluminum oxide layer, and annealing the substrate having the aluminum oxide layer and the hafnium oxide layer thereon.

7. The method of claim 6, wherein cleaning the substrate comprises exposing the substrate to hydrofluoric acid.

8. The method of claim 6, wherein cleaning the substrate comprises exposing the substrate to ionized $NF_3$ and $NH_3$.

9. The method of claim 6, wherein the hafnium oxide layer is formed during an atomic layer deposition process by reacting a hafnium precursor and an oxidizing agent.

10. The method of claim 9, wherein the hafnium precursor is selected from the group consisting of hafnium chloride, tetrakis(diethylamino)hafnium, tetrakis(dimethylamino)hafnium, and tetrakis(ethylmethylamino)hafnium.

11. The method of claim 6, wherein the aluminum oxide layer is formed during an atomic layer deposition process by reacting an aluminum precursor and an oxidizing agent.

12. The method of claim 11, wherein the aluminum precursor is selected from the group consisting of trimethylaluminum, tritertiarybutylaluminum, triisobutylaluminum, and aluminum tetramethylheptandionate.

13. The method of claim 6, wherein the substrate having the aluminum oxide layer and the hafnium oxide layer therein is annealed in an environment having a partial pressure of oxygen less than about 100 millitorr.

14. The method of claim 13, wherein the substrate comprises germanium.

15. A method of forming a gate stack, sequentially comprising:

cleaning a surface of a substrate, wherein cleaning the substrate comprises exposing the substrate to ionized $NF_3$ and $NH_3$;

annealing the substrate in an atmosphere comprising ammonia;

hydroxylating the surface of the substrate in an atmosphere comprising water and ammonia, wherein a relative humidity is between about 45 percent and about 90 percent during the hydroxylating the surface;

depositing an aluminum oxide layer on the surface of the substrate; and depositing a hafnium oxide layer on the aluminum oxide layer, wherein the hafnium oxide layer is formed during an atomic layer deposition process by reacting a hafnium precursor and an oxidizing agent.

* * * * *